United States Patent [19]

Ohshio et al.

[11] Patent Number: 4,968,583
[45] Date of Patent: Nov. 6, 1990

[54] PATTERN FORMING METHOD EMPLOYING ELECTRON BEAM LITHOGRAPHY

[75] Inventors: Shuzo Ohshio, Kawasaki; Koichi Kobayashi, Yokohama, both of Japan

[73] Assignee: Fujitsu Limited, Kawasaki, Japan

[21] Appl. No.: 265,405

[22] Filed: Oct. 31, 1988

[30] Foreign Application Priority Data

Oct. 31, 1987 [JP] Japan ................... 62-274669

[51] Int. Cl.$^5$ ........................... G03C 5/16; G03F 7/26
[52] U.S. Cl. ................................... 430/296; 430/317; 430/942; 430/327; 430/316; 430/323; 430/330; 430/313; 430/318; 156/643
[58] Field of Search ............... 430/296, 317, 942, 327, 430/316, 323, 330, 313, 318; 156/643

[56] References Cited

U.S. PATENT DOCUMENTS

| | | | |
|---|---|---|---|
| 3,063,872 | 11/1962 | Boldebuck | 430/296 |
| 4,464,460 | 8/1984 | Hiraoka et al. | 430/317 X |
| 4,599,137 | 7/1986 | Akiya | 430/296 X |
| 4,657,843 | 4/1987 | Fukuyama | 430/296 X |

OTHER PUBLICATIONS

J. M. Moran et al., "High resolution, steep profile resist patterns", *Journal of Vacuum Science and Technology,* vol. 16, No. 6, Nov.-Dec. 1979, pp. 1620-1624.
Y. Sakakibara et al., "Variable-Shaped Electron-Beam Direct Writing Technology for 1-$\mu$m, VLSI Fabrication", *IEEE Transactions on Electron Devices,* vol. ED-28, No. 11, Nov., 1981, pp. 1279-1284.

*Primary Examiner*—Cynthia Hamilton
*Attorney, Agent, or Firm*—Staas & Halsey

[57] ABSTRACT

Multilayer resist materials containing a lowermost layer having a high resistance to dry etching and made from polymers or copolymers of haloalkylated aromatic vinyl compound possessing a molecular weight and haloalkylation degree sufficient not to cause charging up therein during electron beam exposure, and pattern forming methods using these materials. According to the present invention, fine resist patterns with a high resistance to dry etching and high accuracy and suitable for the production of semiconductor devices can be produced.

11 Claims, 6 Drawing Sheets

PATTERN FORMING METHOD EMPLOYING ELECTRON BEAM LITHOGRAPHY

BACKGROUND OF THE INVENTION

1. Field of the Invention

The present invention relates to electron beam lithography. More particularly, the present invention relates to a multilayer resist material for use in an electron beam lithographic process and a method for the formation of a resist pattern on a substrate or base material such as a metal or semiconductor by using said multilayer resist material. Since the resist material used does not cause charging up or electrification therein during electron beam exposure and such charging up is not induced even if a thickness of the lowermost pattern-receiving layer thereof is increased, and further, the resulting resist pattern exhibits a very high resistance to dry etching, the present invention can be widely utilized, with satisfactory results, in the production of semiconductor devices and similar devices which require a high resolution processing on the order of submicrons, for example, integrated circuits, large-scale integrated circuits, and bubble memory devices.

2. Description of the Related Art

In the production of semiconductor devices and the like, electron beam lithography is frequently used in combination with a multilayer resist process to obtain a high quality and very fine resist pattern having a high resistance to dry etching, such as reactive ion etching, plasma etching or sputter etching, used for a selective etching of the underlying substrate. Typical of these multilayer resist processes are a two-layer resist process and a three-layer resist process.

Generally, the resist material used in the two-layer resist process consists of a thinner upper resist layer sensitive to an electron beam and a thicker lower resist layer, also referred to as a leveling layer because it can effectively level an uneven surface of the underlying substrate, and is highly resistant to dry etching. As an example of this two-layer resist process, a novolak resist such as an "OFPR"-series resist commercially available from Tokyo Oka Co., Ltd., is coated on a selected substrate to form a lower resist layer. To avoid dissolution thereof, the lower resist layer is conventionally insolubilized by a thermal treatment at an elevated temperature of about 200° C. After the insolubilization step, a silicone resist such as silylated polymethylsilsesquioxane (PMSS) is coated on the lower resist layer to form an upper resist layer. The resultant two-layer resist material, is then patterned by electron beam exposure and developed, and a patterned upper resist is thus obtained. Thereafter, the lower resist layer is dry etched by oxygen plasma, for example, through the patterned upper resist which acts as a mask, and the pattern of the upper resist is thus transferred to the underlying resist layer. The resulting resist pattern in the lower resist layer should have higher accuracy and larger thickness, namely, a higher aspect ratio. The term "aspect ratio", as generally recognized in the art, means the ratio of the layer thickness to the pattern width of the resist pattern. A higher aspect ratio indicates that the resist pattern has a high dimensional accuracy.

The two-layer resist process described above is characterized in that the two essential functions of the resist, i.e., formation of fine resist patterns with a high accuracy and leveling of the unevenness of the underlying substrate, rely separately upon upper and lower resist layers which are essentially different from each other. Similarly, although not described herein in detail, the three-layer resist process has been used in the production of semiconductor and other devices on the same grounds. An interlayer to be inserted between the upper resist layer and the lower resist layer is generally used to assist the function of the upper and/or lower layers, if not satisfactory.

The multilayer resist process is generally considered to be one of the most useful resist processes, but suffers from a serious problem of a charging up or electrification of the resist used. This problem occurs during electron beam exposure of the upper resist layer. Namely, when the upper resist layer is irradiated as a pattern with an electron beam, charges of the irradiated electron beam tend to remain in the underlying resist layer such as the novolak resist layer. If these remaining charges are at a high level or are increased, when a subsequent electron beam exposure is carried out on the same resist layer, the irradiated electron beam is bent or curved as a result of the action of a repulsion force of those remaining charges on the resist layer. This incorrect irradiation of the electron beam results in defects such as an incomplete detection of the alignment marks, erroneous registration of the alignment marks, and shifting of the electron beam patterns, thereby causing a notable reduction of the pattern accuracy in the resulting resist patterns.

Several methods of preventing charging up in the resist layer during electron beam exposure have been disclosed. For example, it is disclosed in "Kenkyu Jitsuyoka Hokoku Research and Practice Report", Vol. 33, No. 4, p. 655–663, 1984, published by Nippon Telegraph and Telephone Public Corporation, that the formation of a Mo (molybdenum)-deposited layer on an underlying resist layer will effectively prevent such charging up. As illustrated in FIG. 1, this disclosure teaches a four-layer resist (CMS/Mo/SiO$_2$/AZ) which essentially consists of a semi-electrically insulating GaAs substrate 1 having applied thereon, in sequence, a CVD (chemical vapour deposition)-deposited silicon nitride layer 2, a lower resist layer 3 such as AZ 1470 commercially available from Hoechst AG, a silicon oxide layer 4, a molybdenum layer 5, and an upper resist layer 6 such as CMS (chloromethylated polystyrene). This four-layer resist can prevent charging up during electron beam patterning, and thus can prevent an erroneous alignment of patterns, in comparison with the single CMS resist.

Further, it is disclosed in N. Katoh et al.: "Application of $\phi$-MAC Two-Layer Resist in GaAs IC", Autumn Symposium Preprint, 12p-T-12, Japan Society of Applied Physics, 1984, that a deposition of metals such as Al (aluminum) onto a resist layer effectively prevents charging up in the resist layer. The resist layer used herein is a duplitized resist layer of phenylmethacrylate-methacrylic acid copolymer ($\phi$-MAC), in view of the formation of undercuts for the lift-off process. In the methods of this and the above-cited literature, the metal deposition layer such as Mo and Al has an electrical conductivity, and therefore, can prevent an electrification of the underlying resist layer. Nevertheless, these methods complicate the production process, due to the deposition of metals, and make the detection of alignment marks more difficult due to a reduced transmission of electrons caused by the presence of the deposited metal layer.

In 1986, Y. Takasu et al. disclosed in "Three-Layer Resist Process Using a Coated Conductive Layer as an Interlayer", spring Synposium Preprint, 1p-Z-13, Japan Society of Applied Physics, 1986, that use of an ITO (indium-tin oxide) layer in place of the SOG (spin-on-glass) interlayer in the three-layer resist process can prevent a reduction of the pattern accuracy due to charging up of the resist. As shown in FIG. 2, in this improved method, a silicon substrate 1 has formed thereon, in sequence, a lower resist layer 7 such as OFPR-800 commercially available from Tokyo Oka Co., Ltd., an ITO interlayer 8 and an upper resist layer 9 such as PMMA (polymethylmethacrylate) or OFPR-800. The ITO interlayer 8 can be easily formed by coating, and an electrical insulating property thereof can be converted to an electrical conductivity by a thermal treatment at a temperature of 280° C. or more.

At the same Spring Symposium, M. Kakuti et al. disclosed a two-layer resist process using an electrically conductive carbon resist as a lower resist layer (see, Preprint 1p-Z-10). As shown in FIG. 3, the resist material is formed on a substrate 1 such as quartz and essentially consists of a lower resist layer 10 of plasma CVD carbon and an upper resist layer 11 such as SNR (silicone-type negative-working resist). Since the lower resist layer 10 has an electrical conductivity, this two-layer resist process ensures the conduction of an electron beam exposure on the insulating substrate without charging up the resist layer.

Nevertheless, use of conductive layers such as ITO and CVD carbon requires treatments of such layers at an elevated temperature such as 280° C. or more (for ITO) and 250° to 400° C. (for CVD carbon), and thus has a danger that the underlying substrate will be destroyed. Moreover, as in the use of metal layers as a conductive layer described in the previous paragraphs, the use of a conductive layer is also complicated, due to constitution of the resist used. Since none of the prior art multilayer resist processes completely solves the problem of charging up in the resist layer during the electron beam exposure, there is still a need to provide an improved multilayer resist material and pattern formation method.

As described in detail hereinafter, the present inventors found that the use of particular polymers or copolymers of haloalkylated aromatic vinyl compound as the lowermost layer of the multilayer resist material in an electron beam lithographic process can solve the problems of the prior art methods, including charging up. None of the prior arts discloses or teaches this use and the superior effects thereof. For example, Japanese Unexamined Patent Publication (Kokai) No. 60-257522 teaches a three-layer resist material which, as shown in FIG. 4, consists essentially of a lower resist layer 12, formed on a semiconductor substrate 1, such as negative-working resist, for example, CPMS (chlorinated polymethylstyrene), an interlayer 13 such as Ti (titanium), and an upper resist layer 14 of electron beam-sensitive resist such as polystyrene. Although this application teaches the use of CPMS, the object thereof is not directed to a prevention of charging up of the resist layer during electron beam exposure, in that the object of this application is to prevent cracking caused due to pinholes in the interlayer 13. As disclosed on page 2, left lower column, of referenced application, cracks in the interlayer 13 can be prevented if the interlayer 13 and the upper layer 14 are sequentially formed after gelation of the lower layer 12. Further, according to the method of this application, after coating the lower layer 12 and before formation of the interlayer 13, it is essential to subject the coated layer 12 to a series of steps of prebaking at a predetermined temperature and time, overall exposure of for ultraviolet rays, development of the exposed layer, and a two-step postbake (first postbake and second postbake).

Before inventing the present invention, the inventors found an improved pattern forming method which does not cause a problem of charging up and filed a patent application in Japan on Aug. 27, 1986 under Japanese Patent Application No. 61-199116 (see, Japanese Unexamined Patent Publication (Kokai) No. 63-56655 published on Mar. 11, 1988). The pattern forming method is characterized by coating a negative-working resist consisting of an aromatic vinyl compound polymer which vinyl radical may be partially substituted with halogen on a substrate and irradiating the resist coating with far UV-rays, charged particle rays or X-rays to form a lower layer of the multilayer resist process. However, at that stage, they could not find a combined effect of the molecular weight and haloalkylation degree of polymers or copolymers of haloalkylated aromatic vinyl compound in preventing the charging up during electron beam exposure, and other effects of the present invention.

SUMMARY OF THE INVENTION

An object of the present invention is to provide an improved multilayer resist material which can be processed by electron beam lithography.

Another object of the present invention is to provide an improved method of forming a resist pattern by which charging up of the resist layer is avoided, regardless of the thickness thereof, during the electron beam patterning, the processing is conducted at a relatively lower temperature, and the resulting resist pattern has a high resistance to dry etching.

These objects can be attained according to the present inventions, as described hereinafter.

According to the present invention, there is provided a multilayer resist material for use in an electron beam lithographic process which comprises, at least an outermost resist layer having a high sensitivity to electron beam exposure and a lowermost pattern-receiving layer having a high resistance to dry etching directly applied onto the underlying substrate to be dry etched, said pattern-receiving layer not having applied thereon an electrically conductive layer which can reduce or remove charging up in said pattern-receiving layer during the electron beam exposure, and being made from polymers or copolymers of haloalkylated aromatic vinyl compound possessing a molecular weight and haloalkylation degree sufficient not to cause charging up therein during the electron beam exposure.

According to the present invention, there is also provided a method of forming a resist pattern on a substrate by using an electron beam lithographic process, which comprises the steps of:

(a) applying, to a surface of the substrate to be dry etched, a multilayer resist material which comprises, at least an outermost resist layer having a high sensitivity to electron beam exposure and a lowermost pattern-receiving layer having a high resistance to dry etching directly applied onto the underlying substrate, said pattern-receiving layer not having applied thereon an electrically conductive layer which can reduce or remove charging up in said pattern-receiving layer during the electron beam exposure, and being made from polymers or copolymers of haloalkylated aromatic vinyl compound possessing a molecular weight and haloalkylation degree sufficient not to cause charging up therein during the electron beam exposure, (b) irradiating said multilayer resist material with a desired electron beam pattern to form a latent image corresponding to said irradiation pattern in said outermost resist layer, (c) developing said latent image to obtain a patterned distribution of said outermost resist layer, (d) where one or more interlayers exist between said outermost resist layer and said lowermost pattern-receiving layer, transferring said patterned distribution of said outermost resist layer to said interlayers, and (e) dry etching said lowermost pattern-receiving layer through a mask which is a patterned distribution of said outermost resist layer or lowermost interlayer, to thereby form a patterned distribution of said pattern-receiving layer on said substrate.

The term "electron beam" used herein has a wide meaning and includes electromagnetic radiations such as X-rays and ion beams, in addition to electron beam. Namely, the outermost resist layer has a sensitivity to these radiations.

DESCRIPTION OF THE PREFERRED EMBODIMENTS

Figure 1:
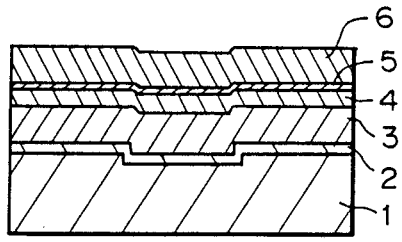
FIG. 1 is a cross-sectional view of the prior art four-layer resist using a Mo-deposited layer as an interlayer.
Figure 2:
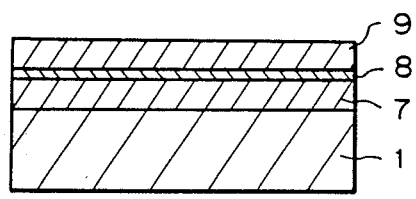
FIG. 2 is a cross-sectional view of the prior art three-layer resist using an ITO layer as an interlayer.
Figure 3:
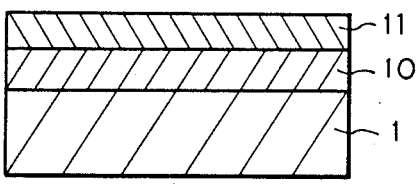
FIG. 3 is a cross-sectional view of the prior art three-layer resist using plasma CVD carbon as a lower resist layer.
Figure 4:
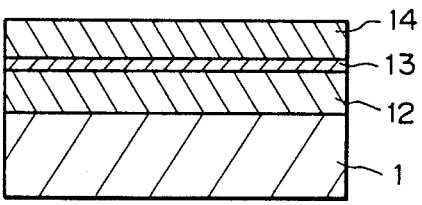
FIG. 4 is a cross-sectional view of the prior art three-layer resist using titanium as an interlayer.
Figure 5:
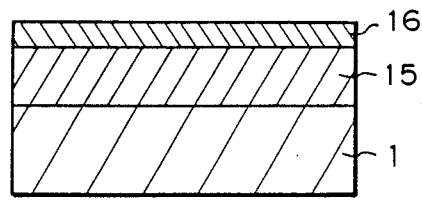
FIG. 5 is a cross-sectional view of the two-layer resist according to the present invention.

The resist material used in the multilayer resist process of the present invention essentially consists of two or more layers of resist, i.e., a two-layer resist or three-layer resist. A typical example of the two-layer resist of the present invention is shown in FIG. 5. As shown in the Figure, a substrate 1 has coated thereon, in sequence, a lower resist layer (herein also lowermost pattern-receiving layer) 15 and an upper resist layer (herein also outermost resist layer) 16. The upper resist layer 16 has a high sensitivity to electron beam patterning, and therefore, is used to form a desired fine pattern of resist. The lower resist layer 15, which is generally thicker than the upper resist layer 16, will reveal an uneven surface if any of the substrate 1 and, after transfer of the resist pattern of the upper layer 16 thereto, can reproduce the corresponding resist pattern therein. This resist pattern has a high resistance to dry etching, and therefore, is used as a mask when the substrate is dry etched to fabricate parts thereon. Since the material of the lower resist layer 15 does not cause charging up therein, it is not necessary to insert an electrically conductive layer between this layer and the upper resist layer 16.

Figure 6:
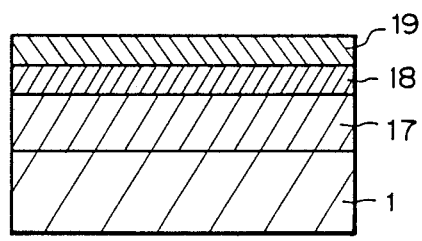
FIG. 6 is a cross-sectional view of the three-layer resist according to the present invention.

If the upper resist layer and/or the lower resist layer is insufficient, or it is desired to increase the functions of the resulting resist material, an interlayer is generally inserted between the upper and lower layers of the two-layer resist to aid or improve the functions of the upper and/or lower layers. This is referred to as a three-layer resist process, and a typical example thereof is shown in FIG. 6. In FIG. 6, a three-layer resist formed on a substrate 1 consists of a lower or lowermost resist layer 17, an interlayer 18, and an upper or outermost resist layer 19. The functions of the layers 17 and 19 are substantially the same as those of the layers 15 and 16 of FIG. 5. Generally, the interlayer 18 can compensate insufficient properties or functions of the upper layer 19, for example, insufficient resistance to oxygen-reactive ion-etching used during the transfer of the resist pattern of the upper layer to the lower layer.

In the multilayer resist material of the present invention, the lowermost pattern-receiving layer having a high resistance to dry etching is made from polymers or copolymers of haloalkylated aromatic vinyl compound possessing a molecular weight and haloalkylation degree sufficient not to cause charging up therein during electron beam exposure. The polymers or copolymers useful as such lowermost layer are preferably those having the following formula:

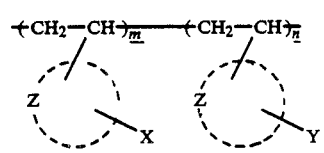

wherein
Z each represents atoms necessary to complete a substituted or unsubstituted aromatic ring,
X represents a haloalkyl group or an alkyl group substituted with a halogen such as Cl, Br and I,
Y may or may not be present, and if present, represents a halogen such as Cl, Br and I, and
m and n each represents a polymerization degree,
said polymers or copolymers having a molecular weight of 13,000 or less and a haloalkylation degree, defined as percentage of m/(m+n)×100, of 50% or more. They may be monodispersed or polydispersed, although the monodisperse CMS was used in the Example 1 described hereinafter.

The aromatic ring represented by Z in the above formula is preferably as follows:

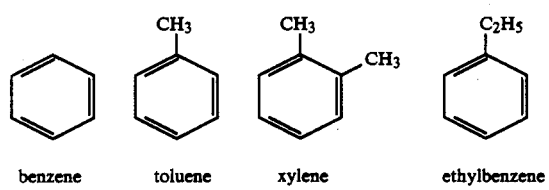

benzene    toluene    xylene    ethylbenzene

-continued

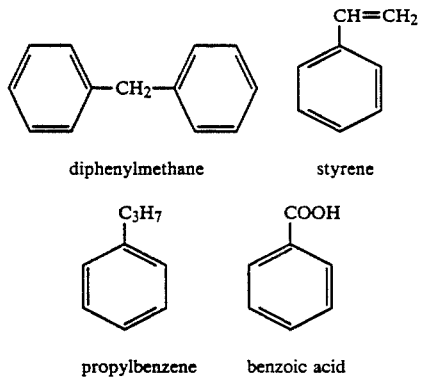

diphenylmethane  styrene propylbenzene  benzoic acid

If desired, these aromatic rings may be replaced by any group which will not adversely affect the functions of the polymers or copolymers.

X in the above formula represents a haloalkyl group, preferably chloromethyl. Further, X, if present, represents a halogen, preferably chlorine. In this case, the haloalkylation degree, defined as a percentage of $m/(m+n) \times 100$, is referred to as a chloromethylation degree.

The molecular weight of the polymers or copolymers constituting the lowermost layer is 13,000 or less, preferably 10,000 or less. A lower limit of this molecular weight is not especially restricted in the polymers or copolymers of the present invention, but in view of factors such as film formation and heat resistance, the polymers or copolymers preferably have a molecular weight of 2000 or more. As can be seen from the above, the polymers or copolymers have a relatively low molecular weight, and such a low molecular weight can greatly contribute to the prevention of charging up in the lowermost layer. The inventors assume that a regular arrangement of molecules of the polymers or copolymers is produced as a result of a reduction of the molecular weights thereof. Such regular arrangement of molecules induces a periodicity of potentials, and thus a uniform distribution of electron carriers, whereby charging up in the resist layer during electron beam patterning can be effectively prevented.

In addition, the haloalkylation degree, and particularly, the chloromethylation degree of the used polymers or copolymers, is 50% or more, preferably 70% or more.

Suitable polymers or copolymers as the lowermost layer include, for example, CMS (chloromethylated polystyrene), PCS (poly-4-chlorostyrene), αCMS (poly α-methylstyrene), PVB (polybenzylchloride) and the like. Particularly suitable polymers or copolymers include copolymers having the following formulae:

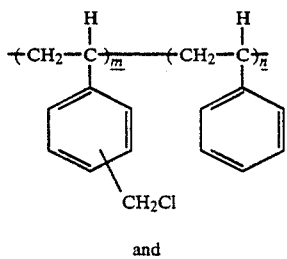

and

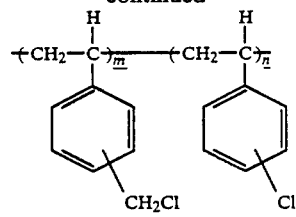

wherein m and n are as defined above.

The polymers or copolymers described above can be prepared by conventional methods. For example, CMS or chloromethylated polystyrene can be prepared by a chloromethylation of polystyrene with an agent such as di(chloromethyl) ether or the like. For example, $SiCl_4$ is used as a catalyst in this preparation process.

The outermost resist layer of the present invention may be formed from any electron beam-sensitive resist materials conventionally used in the field of electron beam lithography. Suitable electron beam-sensitive resist materials include a silicon-containing polymeric resist such as silylated or unsilylated polymethylsilsesquioxane (PMSS), chloromethylated polydiphenylsiloxane and the like. For example, these polysilsesquioxanes can be easily prepared by condensing trifunctional siloxane and, if necessary, effecting a substitution at any position of the product.

If an interlayer is used, for example, between the upper layer and the lower layer, in the production of three-layer resist, it is preferably formed from a organic silicon compound such as $SiO_2$ or SOG.

The thickness of the two or more layers constituting the multilayer resist material of the present invention is not limited, and can be widely varied depending upon the desired results and other factors. But, the lowermost pattern-receiving layer should have a notably increased thickness in comparison with the thickness of the outermost resist layer.

The method of forming a resist pattern according to the present invention, as previously described, comprises the steps of:
(a) application of the present multilayer resist material on the substrate,
(b) electron beam exposure,
(c) development of latent images,
(d) treatment of interlayer, if any, and
(e) dry etching of the lowermost layer.

In a preferred embodiment of the present invention, step (a) of applying the multilayer resist material on the substrate can be carried out by:
(i) coating on a cleaned surface of the substrate a solution of selected polymers or copolymers of haloalkylated aromatic vinyl compound to form the lowermost pattern-receiving layer,
(ii) insolubilizing the pattern-receiving layer to a solution used in the next layer formation or a layer itself,
(iii) if required, forming one or more interlayers on the insolubilized pattern-receiving layer, and
(iv) coating on the insolubilized pattern-receiving layer, or the interlayers, a solution of the selected electron beam-sensitive resist material to form the outermost resist layer.

In another preferred embodiment of the present invention, the insolubilization step (ii) can be carried out by heating the lowermost layer upon irradiation of far ultraviolet rays. Further, in some cases, electron beams, X-rays, ion beams or other electromagnetic radiations may be used instead of the far ultraviolet rays.

Further, the developing step (c) can be carried out by dipping the exposed multilayer resist material in a developing solution suitable for the outermost resist layer.

Furthermore, a transfer of the patterned distribution of the outermost resist layer to the interlayers in step (d) can be carried out by dry etching the interlayers through the patterned outermost resist layer, which acts as a mask.

Figure 7A:
FIGS. 7A to 7F are cross-sectional views showing, in sequence, the pattern forming method according to the present invention in which the two-layer resist of FIG. 5 is used.

FIGS. 7A to 7F illustrate, in sequence, a typical example of the formation of resist patterns from the two-layer resist material according to the present invention, in which:

FIG. 7A is a cross-sectional view of a substrate 1, such as a silicon wafer. Although not illustrated, the substrate 1 may contain any parts fabricated on a surface thereof. Such parts are those intended to be dry etched to form an etched pattern thereof and include a metal circuit layer and electrically insulating layer, for example. The surface of this substrate 1 to be dry etched has been cleaned.

Figure 7B:
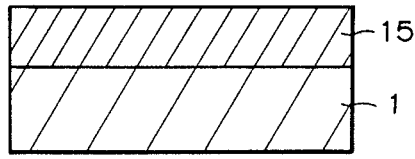

FIG. 7B shows a lower resist layer 15 such as CMS on the substrate 1. This resist layer 15 can be formed, for example, by spin coating from a solution of the selected resist material. After spin coating, the layer is baked and insolubilized. Insolubilization of this resist layer 15 can be obtained, for example, by irradiation of far UV rays.

Figure 7C:
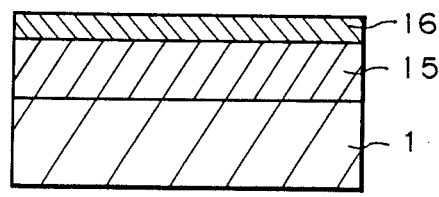

FIG. 7C shows a formation of an upper resist layer 16 such as PMSS on the lower resist layer 15. A solution of PMSS is spun-coated on the layer 15 and then baked, and thus the illustrated two-layer resist material is obtained.

Figure 7D:
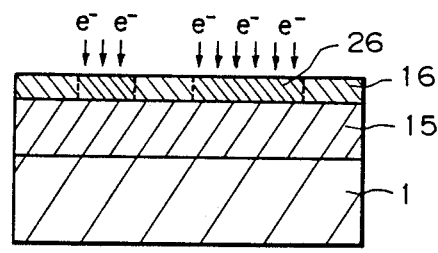

FIG. 7D illustrates an electron beam exposure of the resist material. The resist material, and particularly the upper layer 16, is pattern irradiated with an electron beam $e^-$ at an accelerated voltage, whereby upon the electron beam exposure, the exposed areas 26 of the layer 16 are insolubilized.

Figure 7E:
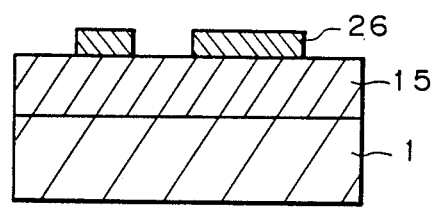

FIG. 7E illustrates development of the exposed upper layer 26. This can be carried out by dipping the coated substrate 1 in a selected developer to wash off the unexposed area of the upper layer 16. After development, the resist pattern 26 is formed on the lower layer 15.

Figure 7F:
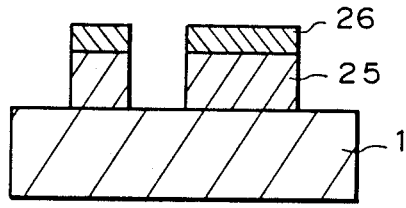

FIG. 7F illustrates a transfer of the resist pattern 26 to the underlying layer 25. This can be carried out, for example, by dry etching the layer 25 through the pattern 26, which acts as a mask, with oxygen plasma. The etched layer 25 has perpendicular side walls.

As understood from the above description, the molecular weight and haloalkylation degree of the polymers or copolymers of haloalkylated aromatic vinyl compound, when combined, play an important role in preventing a charging up of the resist, removing a thickness dependency of such a prevention of charging up, and ensuring an increased resistance to dry etching. The reasons why these effects can be attained as a result of combination of particular molecular weight and particular haloalkylation degree are not clear, but may be as follows:

that the lowermost layer can possess an ionic conductivity because a material thereof has haloalkyl substituents, and that disturbance of the arrangement of resist molecules is inhibited because the resist has a reduced molecular weight.

Thus, according to the present invention, in the pattern formation using the multilayer resist process, charging up in the resist layer during the electron beam exposure can be prevented, and accordingly, a resist pattern having a high accuracy can be formed. Further, since this resist process can be carried out at a relatively low temperature, workability of the process can be notably increased.

The present invention will be further clarified with reference to the following working examples:

EXAMPLE 1

Monodisperse CMS or chloromethylated polystyrenes of the formula:

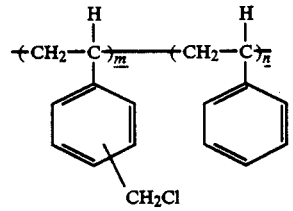

having different molecular weights of from 7500 to 13,000 and different chloromethylation degrees of from 0 to 100% were prepared from a chloromethylation of polystyrene with di(chloromethyl)ether.

The resultant CMS was dissolved in xylene and the xylene solution of CMS was spun-coated to a thickness of 2.0 μm on an aluminum substrate to estimate the charge up and then baked at 100° C. for 20 minutes in a nitrogen gas stream. The CMS coating as a lower resist layer was irradiated with far UV rays from an Xe-Hg lamp (500 W) for 40 seconds, and thus the CMS coating was insolubilized. Thereafter, a solution of silylated polymethylsilsesquioxane (PMSS) ($M_w$=25,000) in n-butylether, the hydroxyl terminals thereof having been silylated with trimethylchlorosilane, was spun-coated to a thickness of 0.2 μm on the CMS coating and then baked at 80° C. for 20 minutes. In a nitrogen gas stream, and thus the two-layer resist of the present invention was formed on the aluminum substrate.

The aluminum substrate with the two-layer resist was placed in an electron beam exposure apparatus and irradiated with a predetermined electron beam pattern at an accelerated voltage of 20 kV and an exposure level of $2 \times 10^{-5}$ C/cm². The exposed PMSS coating was developed by dipping the substrate in methyl isobutyl ketone (MiBK) for one minute and then rinsing in isopropyl alcohol (IPA) for 30 seconds, whereby PMSS patterns were formed on the underlying CMS coating.

The substrate with the PMSS pattern was placed in a plasma etching device (RF power: 300 W; $O_2$: 100 sccm; Pressure: 0.02 Torr), and the CMS coating thereof was dry etched with oxygen plasma from a carbon target through a mask of the PMSS pattern. This oxygen-reactive ion etching was conducted for 5 minutes. The PMSS mask patterns were accurately transferred to the CMS coating. A resolution power of the resultant CMS patterns was 0.3 μm line and 0.3 μm space.

Charging up in the CMS patterns of all samples tested was determined, and was evaluated in terms of the amount (μm) of a shift of the CMS pattern from the standard pattern. The results are shown in Table 1 and FIGS. 8 and 9.

TABLE 1

| Sample | Chloromethylation degree (%) | $M_W$ | Charging up (μm) |
|---|---|---|---|
| 1 | 0 | 13000 | 2.0 |
| 2 | 15 | 13000 | 1.3 |
| 3 | 30 | 13000 | 0.8 |
| 4 | 50 | 13000 | 0.5 |
| 5 | 90 | 13000 | 0.2 |
| 6 | 0 | 7500 | 2.0 |
| 7 | 30 | 7500 | 0.5 |
| 8 | 50 | 7500 | 0.1 |
| 9 | 100 | 7500 | 0.1 |

These results show that a satisfactory prevention of charging up can be obtained if the CMS used has a molecular weight of 13,000 or less and a chloroalkylation degree of 50% or more.

Figure 8:
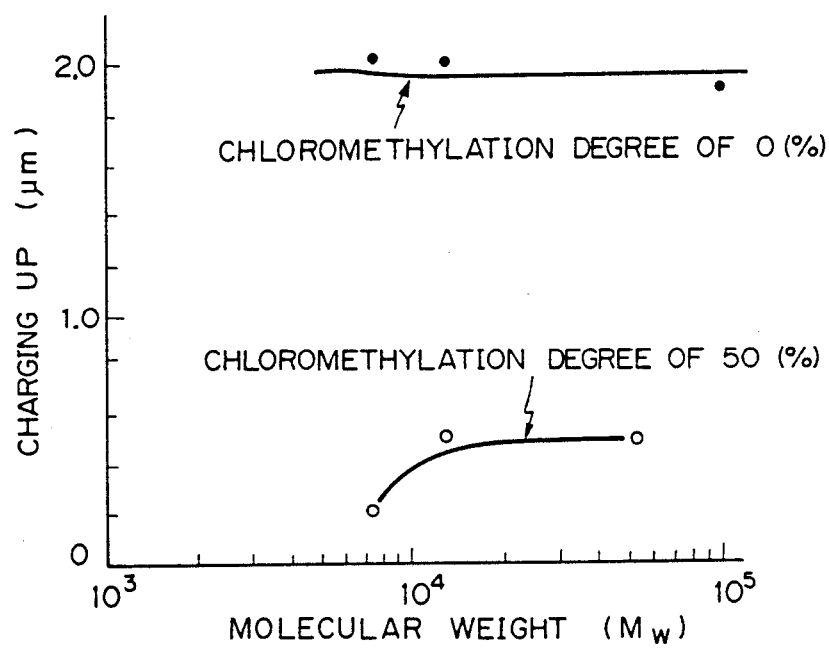
FIG. 8 is a graph showing the influence of molecular weight and chloromethylation degree on charging up of the resist.
Figure 9:
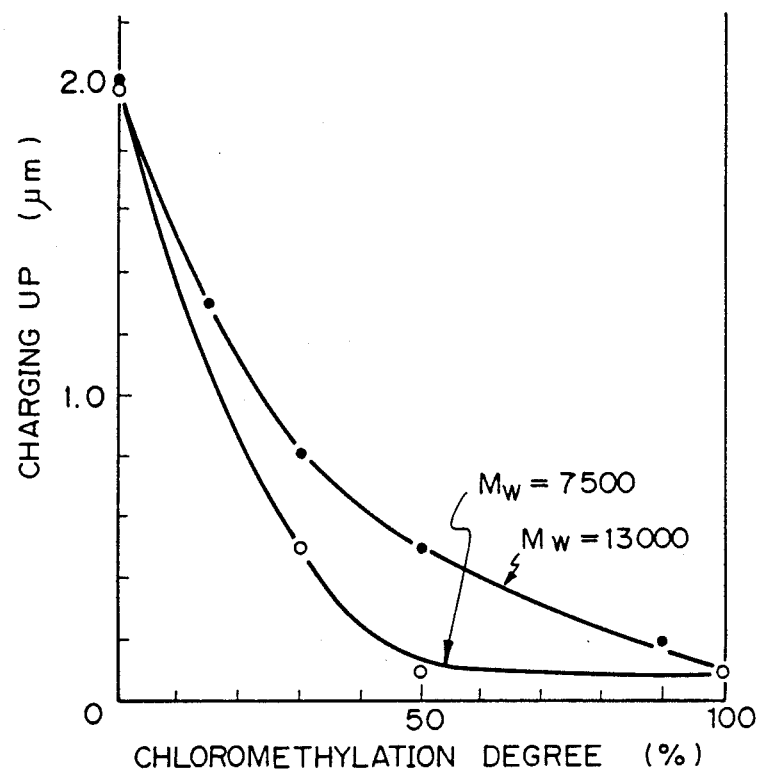
FIG. 9 is a graph showing the influence of chloromethylation degree on charging up of the resist; and, FIG. 10 is a graph showing the influence of chloromethylation degree on charging up of the resist.

Using the data shown in Table 1, the influence of the chloromethylation degree of CMS on the charging up of the CMS resist layer was plotted as shown in FIGS. 8 and 9 and the influence of the molecular weight of CMS on the charging up of the CMS resist layer is shown in FIG. 8.

COMPARATIVE EXAMPLE 2

The procedure of Example 1 described above was repeated except that OFPR-800 (novolak resist commercially available from Tokyo Oka Co., Ltd.; trade name) was used as a lower resist instead of CMS and was spun-coated to a thickness of 2.0 μm and then baked at 250° C. for one hour. The resultant OFRR patterns indicated a charging up of 2.4 μm.

EXAMPLE 3

Figure 10:
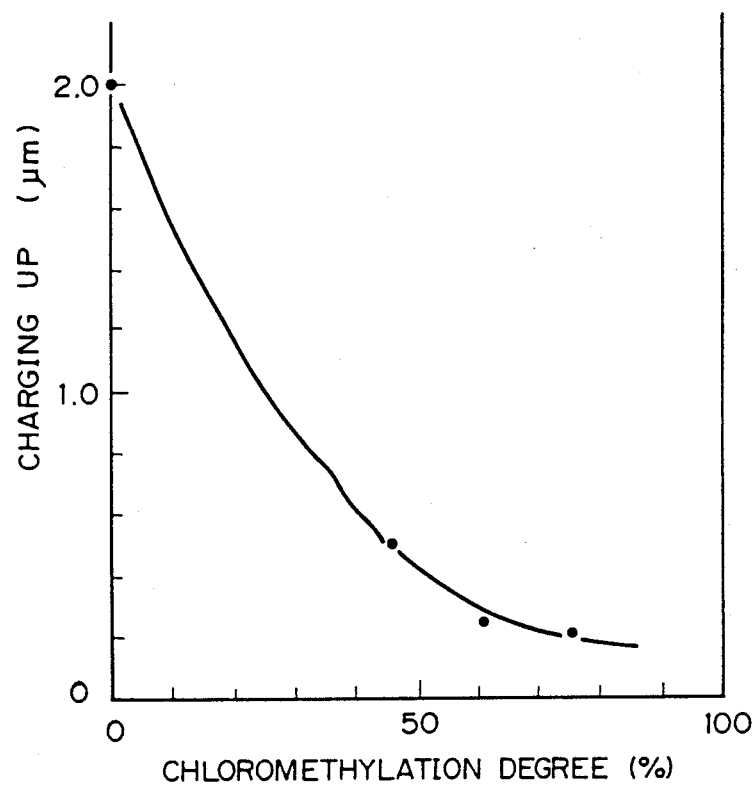

The procedure of Example 1 described above was repeated except that the copolymeric resist, poly(-chloromethylstyrene-co-chlorostyrene) ($M_W$=10,000) of the formula:

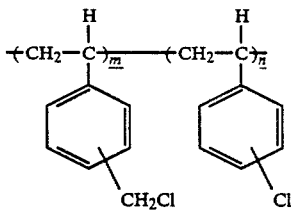

having different chloromethylation degrees were used as a lower resist instead of CMS. The results were plotted as shown in FIG. 10, which shows an influence of the chloromethylation degree of the resist on the charging up. The graph of FIG. 10 shows that a chloromethylation degree of 50% or more is acceptable.

We claim:

1. A method for forming a resist pattern on a substrate by electron beam lithography comprising:
    (a) applying onto a surface of a substrate to be dry etched a multilayer resist cover including at least an outermost layer of a resist material having high sensitivity to electron beam exposure and a lowermost pattern-receiving layer having high resistance to dry etching directly applied onto the underlying substrate, said pattern-receiving layer being made from polymers or copolymers of haloalkylated aromatic vinyl compounds, wherein said multilayer resist cover is applied by:
        (i) coating a solution of said polymers or copolymers on a clean surface of said substrate to thereby form the pattern-receiving layer,
        (ii) insolubilizing said pattern-receiving layer by heating the same using far-ultraviolet radiation,
        (iii) if required, forming one or more interlayers on said insolubilized pattern-receiving layer, and
        (iv) coating a solution of said resist material on said insolubilized layer, or on the uppermost interlayer if one or more interlayers are required, to thereby form said outermost layer, said pattern receiving layer being insolubilized in step (ii) relative to the interlayer formed thereon if one or more interlayers is required, relative to the layer of resist material if no interlayer is required and relative to the solutions, if any, used to form the interlayer or the layer of resist material.
    (b) irradiating said multilayer resist cover with a desired electron beam pattern to form a latent image corresponding to said irradiation pattern in said outermost resist layer,
    (c) developing said latent image to obtain a patterned distribution of said outermost resist layer,
    (d) where one or more interlayers exist between said outermost resist layer and said lowermost pattern-receiving layer, transferring said patterned distribution of said outermost resist layer to said one or more interlayers, and
    (e) dry etching said lowermost pattern-receiving layer through a mask which is said patterned distribution of said outermost resist layer or lowermost interlayer, if any, with oxygen gas containing plasma, to thereby form a patterned distribution of said pattern-receiving layer on said substrate, said polymers or copolymers from which the pattern-receiving layer is made having a molecular weight of 13,000 or less and a haloalkylation degree of 50% or more whereby charging up of the resist layer during electron beam patterning is prevented.

2. A method according to claim 1, in which said lowermost pattern-receiving layer is made from a copolymer having the following formula:

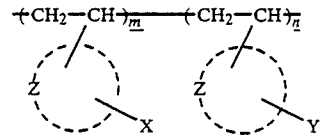

wherein
   each Z represents atoms necessary to complete a substituted or unsubstituted aromatic ring,
   X represents a haloalkyl group,
   Y may or may not be present, and if present, represents a halogen, and
   m and n each represents a polymerization degree,
said copolymer having a molecular weight of 13,000 or less and a haloalkylation degree, defined as percentage of m/(m+n)×100, of 50% or more.

3. A method according to claim 2, in which said aromatic vinyl copolymer has the formula:

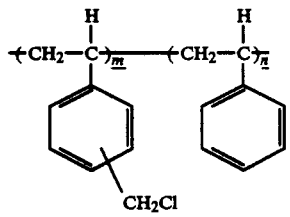

wherein m and n each represents a polymerization degree necessary to provide a chloromethylation degree of 50% or more.

4. A method according to claim 2, in which said aromatic vinyl copolymer has the formula:

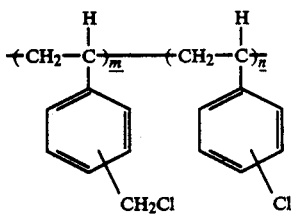

wherein m and n each represents a polymerization degree necessary to provide a chloromethylation degree of 50% or more.

5. A method according to claim 1, in which said outermost resist layer is made from silylated or unsilylated polymethylsilsesquioxane.

6. A method according to claim 1, in which the developing in said step (c) is carried out by dipping the exposed multilayer resist material in a developing solution suitable for said outermost resist layer.

7. A method according to claim 1, in which the transfer of said patterned distribution of said outermost resist layer to said interlayers in said step (d) is carried out by dry etching said interlayers through said patterned outermost resist layer which acts as a mask.

8. A method for forming a resist pattern on a substrate by electron beam lithography comprising:
(a) applying onto a surface of a substrate to be dry etched a multilayer resist cover including at least an outermost layer of a silylated or unsilylated polymethylsilsesquioxane resist material having high sensitivity to electron beam exposure and a lowermost pattern-receiving layer having high resistance to dry etching directly applied onto the underlying substrate, said pattern-receiving layer being made from polymers or copolymers of haloalkylated aromatic vinyl compounds, wherein said multilayer resist cover is applied by:
  (i) coating a solution of said polymers or copolymers on a clean surface of said substrate to thereby form the pattern-receiving layer,
  (ii) insolubilizing said pattern-receiving layer by heating the same using far-ultraviolet radiation, and
  (iii) coating a solution of said resist material on said insolubilized layer to form said outermost layers, said pattern receiving layer being insolubilized in step (ii) relative to the layer of resist material and relative to the solution used to form the layer of resist material,
(b) irradiating said multilayer resist cover with a desired electron beam pattern to form a latent image corresponding to said irradiation pattern in said outermost resist layer,
(c) developing said latent image to obtain a patterned distribution of said outermost resist layer,
(d) dry etching said lowermost pattern-receiving layer through a mask which is said patterned distribution of said outermost resist layer with oxygen gas containing plasma, to thereby form a patterned distribution of said pattern-receiving layer on said substrate, said polymers or copolymers from which the pattern-receiving layer is made having a molecular weight of 13,000 or less and a haloalkylation degree of 50% or more whereby charging up of the resist layer during electron beam patterning is prevented.

9. A method according to claim 8, wherein said polymers or copolymers have a molecular weight in the range of from about 2000 to about 13,000.

10. A method according to claim 8, wherein said polymers or copolymers have a haloalkylation degree of 70% or more.

11. A method according to claim 9, wherein said polymers or copolymers have a haloalkylation degree of 70% or more.

* * * * *